United States Patent
Prager et al.

(10) Patent No.: US 10,027,314 B2
(45) Date of Patent: Jul. 17, 2018

(54) NONLINEAR TRANSMISSION LINE HIGH VOLTAGE PULSE SHARPENING

(71) Applicant: Eagle Harbor Technologies, Inc., Seattle, WA (US)

(72) Inventors: James R. Prager, Seattle, WA (US); Timothy M. Ziemba, Bainbridge Island, WA (US); Kenneth E. Miller, Seattle, WA (US)

(73) Assignee: EAGLE HARBOR TECHNOLOGIES, INC., Seattle, WA (US)

(*) Notice: Subject to any disclaimer, the term of this patent is extended or adjusted under 35 U.S.C. 154(b) by 0 days.

(21) Appl. No.: 15/479,183

(22) Filed: Apr. 4, 2017

(65) Prior Publication Data

US 2018/0102770 A1   Apr. 12, 2018

Related U.S. Application Data

(60) Provisional application No. 62/406,710, filed on Oct. 11, 2016.

(51) Int. Cl.
*H03K 5/12* (2006.01)
*H01P 5/02* (2006.01)

(52) U.S. Cl.
CPC .............. *H03K 5/12* (2013.01); *H01P 5/022* (2013.01)

(58) Field of Classification Search
CPC .................................. H01P 5/022; H03K 5/12
USPC ......................................................... 327/170
See application file for complete search history.

(56) References Cited

U.S. PATENT DOCUMENTS

| 5,014,018 | A  | * | 5/1991  | Rodwell ............... H03H 7/325 257/480 |
| 5,804,921 | A  | * | 9/1998  | McEwan ............... H03K 17/80 307/106 |
| 8,922,973 | B1 |   | 12/2014 | Elizondo-Decanini |
| 2007/0030102 | A1 |   | 2/2007  | Afshari et al. |
| 2007/0273454 | A1 | * | 11/2007 | Pepper .................. H03B 19/05 333/20 |
| 2012/0242192 | A1 |   | 9/2012  | Baird et al. |

OTHER PUBLICATIONS

International Search Report and Written Opinion, as issued in connection with International Patent Application No. PCT/US2017/053369, dated Nov. 27, 2017, 9 pgs.

* cited by examiner

*Primary Examiner* — William Hernandez
(74) *Attorney, Agent, or Firm* — Sanders IP Law

(57) ABSTRACT

Some embodiments include a high voltage nonlinear transmission line that includes a high voltage input configured to receive electrical pulses having a first peak voltage that is greater than 5 kV having a first rise time; a plurality of circuit elements electrically coupled with ground, each of the plurality of circuit elements includes a resistor and a nonlinear semiconductor junction capacitance device; a plurality of inductors, at least one of the plurality of inductors is electrically coupled between two circuit elements of the plurality of circuit elements; and a high voltage output providing a second peak voltage with a second rise time that is faster than the first rise time.

21 Claims, 9 Drawing Sheets

NONLINEAR TRANSMISSION LINE HIGH VOLTAGE PULSE SHARPENING

GOVERNMENT RIGHTS

This invention was made with government support under Award Number DE-SC0013747 by the Department of Energy. The government has certain rights in the invention.

BACKGROUND

Producing high voltage pulses with fast rise times is challenging. For instance, to achieve a fast rise time (e.g., less than 50 ns) for a high voltage (e.g., greater than 10 kV) pulse, the slope of the pulse rise must be quite steep. Such a steep rise time is very difficult to produce and especially difficult using standard electrical components in a compact manner. It is additionally difficult to produce such a high voltage pulse with fast rise times having variable pulse widths and/or a high pulse repetition rate.

SUMMARY

Some embodiments include a high voltage nonlinear transmission line that includes a high voltage input configured to receive electrical pulses having a first peak voltage that is greater than 5 kV having a first rise time; a plurality of circuit elements electrically coupled with ground, each of the plurality of circuit elements includes a resistor and a nonlinear semiconductor junction capacitance device; a plurality of inductors, at least one of the plurality of inductors is electrically coupled between two circuit elements of the plurality of circuit elements; and a high voltage output providing a second peak voltage with a second rise time that is faster than the first rise time.

In some embodiments, the second peak voltage is substantially the same as the first peak voltage.

In some embodiments, each of the plurality of inductors has an inductance of less than about 500 nH.

In some embodiments, each of the plurality of resistors have a resistance of less than about 1000 ohms.

In some embodiments, each of the plurality of nonlinear semiconductor junction capacitance devices have an inductance of less than about 100 nH.

In some embodiments, each of the nonlinear semiconductor junction capacitance devices comprise a diode.

In some embodiments, each of the nonlinear semiconductor junction capacitance devices have a capacitance that changes nonlinearly with voltage.

In some embodiments, the plurality of circuit elements comprise at least 10 circuit elements.

In some embodiments, each of the nonlinear semiconductor junction capacitance devices comprises a plurality of nonlinear semiconductor junction capacitance devices arranged in parallel and/or series.

In some embodiments, the nonlinear semiconductor junction capacitance device has a capacitance less than 10 nF.

BRIEF DESCRIPTION OF THE FIGURES

These and other features, aspects, and advantages of the present disclosure are better understood when the following Detailed Description is read with reference to the accompanying drawings.

DISCLOSURE

Figure 1:
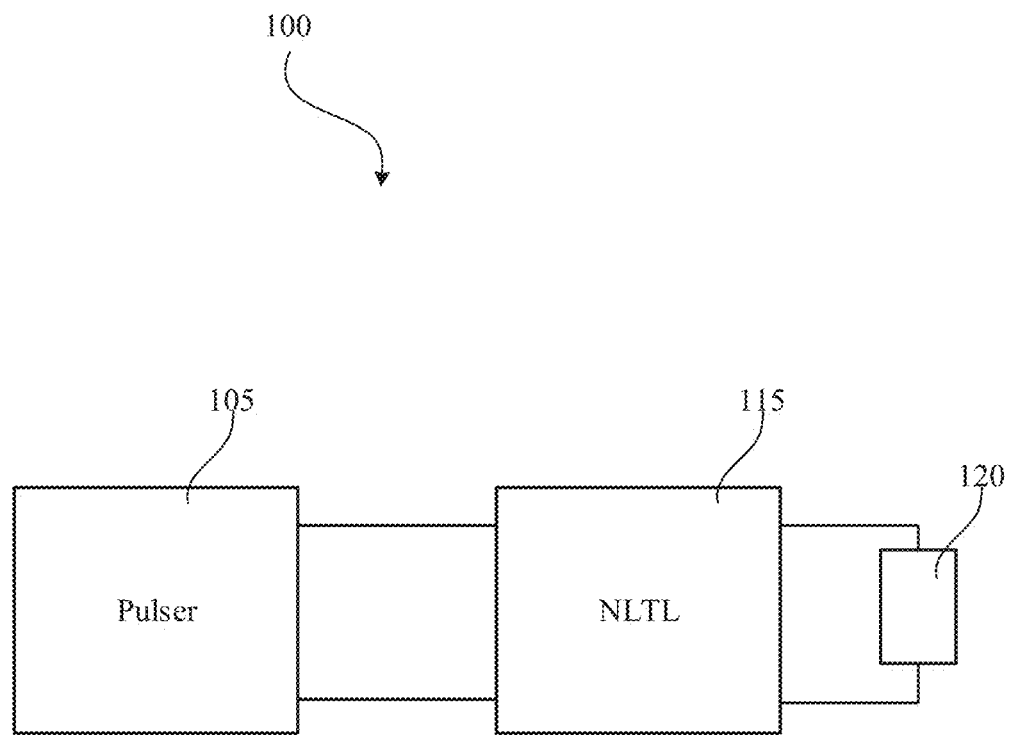
FIG. 1 is a block diagram of a nanosecond pulser and a nonlinear transmission line according to some embodiments.

A nonlinear transmission line is disclosed. In some embodiments, the nonlinear transmission line may include a plurality of nonlinear semiconductor junction capacitance devices (e.g., nonlinear inductors and/or nonlinear capacitors). In some embodiments, the nonlinear transmission line may sharpen the rise time of a high voltage input pulse that may, for example, have a variable pulse width and/or a high pulse repetition rate.

Some embodiments of the invention include the use of a nonlinear semiconductor junction capacitance device. A nonlinear semiconductor junction capacitance device in some voltage regimes may have a capacitance that varies as voltage across the nonlinear semiconductor junction capacitance device.

A nonlinear semiconductor junction can include a P-type or an N-type junction. A semiconductor junction defined by the boundary between regions of P-type and N-type conductivity material is a capacitor under certain conditions. This junction capacitance arises from the electrical charge of the depletion layer or space-charge region associated with the junction. The space-charge region identifies a volume adjoining the junction on both sides within which the net fixed charge arising from the presence of ionized impurity atoms is not neutralized by mobile charge carriers. Outside of the depletion layer the mobile carriers, holes in the P-type material and electrons in the N-type, are present in almost exactly the right numbers to neutralize the fixed charges.

If the junction is biased slightly in the forward or reverse direction by applying a voltage to a contact on one side of the junction, this voltage urges the hole and electron distributions to move toward or away from each other, respectively. Additional holes and electrons enter or leave the semiconductor at the contacts to maintain the neutrality of the P-type and N-type regions as the depletion layer narrows or widens. Therefore, a certain amount of charge is introduced at the terminals of the device and, neglecting recombination or generation of charge carriers, the same amount of charge returns if the applied voltage is changed back to zero. Thus, the semiconductor junction device is like a capacitor. The relation between the applied voltage and the amount of charge introduced at the terminals is nonlinear; i.e. the capacitance, defined as the rate of change of charge as voltage is changed, depends upon the voltage.

A nonlinear semiconductor junction can also include a metal-semiconductor junction in which a metal is in close contact with a semiconductor material. This close contact between the metal and the semiconductor material can create a junction capacitance that may vary with applied voltage. A metal-semiconductor junction can be referred to as a Schottky barrier diode, Schottky barrier junction, or a point contact diode. A metal-semiconductor junction may include, for example, a metal with either a P-type or an N-type semiconductor region.

In some embodiments, a NSJC device may be a capacitor or a number of plurality of capacitors. In some embodiments, a NSJC device may include two parallel conductors (or a capacitor) etched on a circuit board.

FIG. 1 is a block diagram of a system having a high voltage pulser 105 and a nonlinear transmission line 115 according to some embodiments. The system may or may not also include an output 120 coupled with the output of the nonlinear transmission line 115. In some embodiments, for example, a floating output of the high voltage pulser 105 can be electrically coupled with the nonlinear transmission line 115.

The high voltage pulser 105 may include, for example, a plurality of solid state switches (e.g., IGBTs, MOSFETs, FETs, SiC, GaN switches) and/or a transformer. The high voltage pulser 105 may, for example, be designed and/or constructed with low stray inductance and/or low stray capacitance. The high voltage pulser 105 may, for example, produce high voltage pulses having a fast rise time, a high voltage (e.g., greater than 1 kV), a variable pulse width, a high repetition rate, etc. Any type of high voltage pulser may be used. The high voltage pulser 105 may include the high voltage nanosecond pulser described in U.S. Patent Publication 2015/0130525 and/or U.S. Patent Publication 2015/0318846 the entirety of each of which are incorporated by reference for disclosing a pulser 105.

In some embodiments, the high voltage pulser 105 may, for example, operate with variable pulse widths, voltages greater than 1 kV (or even up to 100 kV), and/or a pulse repetition frequency of 10 kHz-100 kHz.

In some embodiments, the high voltage pulser 105 may operate in a single pulse regime, or in a regime with long pulses.

The nonlinear transmission line 115, for example, may sharpen the rise time of one or more high voltage pulses (e.g., decrease the rise time, speed up the rise time, etc.) produced by the high voltage pulser 105. The sharpened output pulse may have substantially the same high voltage, substantially the same repetition rate, and/or substantially the same variable pulse width as the one or more voltage pulses produced by the high voltage pulser 105. The nonlinear transmission line 115 may include the nonlinear transmission line 200, 300, 400, 500, 600 or some variation thereof.

In some embodiments, the output 120 may produce a high voltage output that has about the same voltage provided by the input (e.g., from the high voltage pulser 105). In some embodiments, an output pulse may have a rise time that is faster than the input rise time. For example, an input pulse may have a voltage of 10 kV and a rise time of 20 ns; the output pulse may have a voltage of 10 kV and a rise time of 10 ns.

Figure 2:
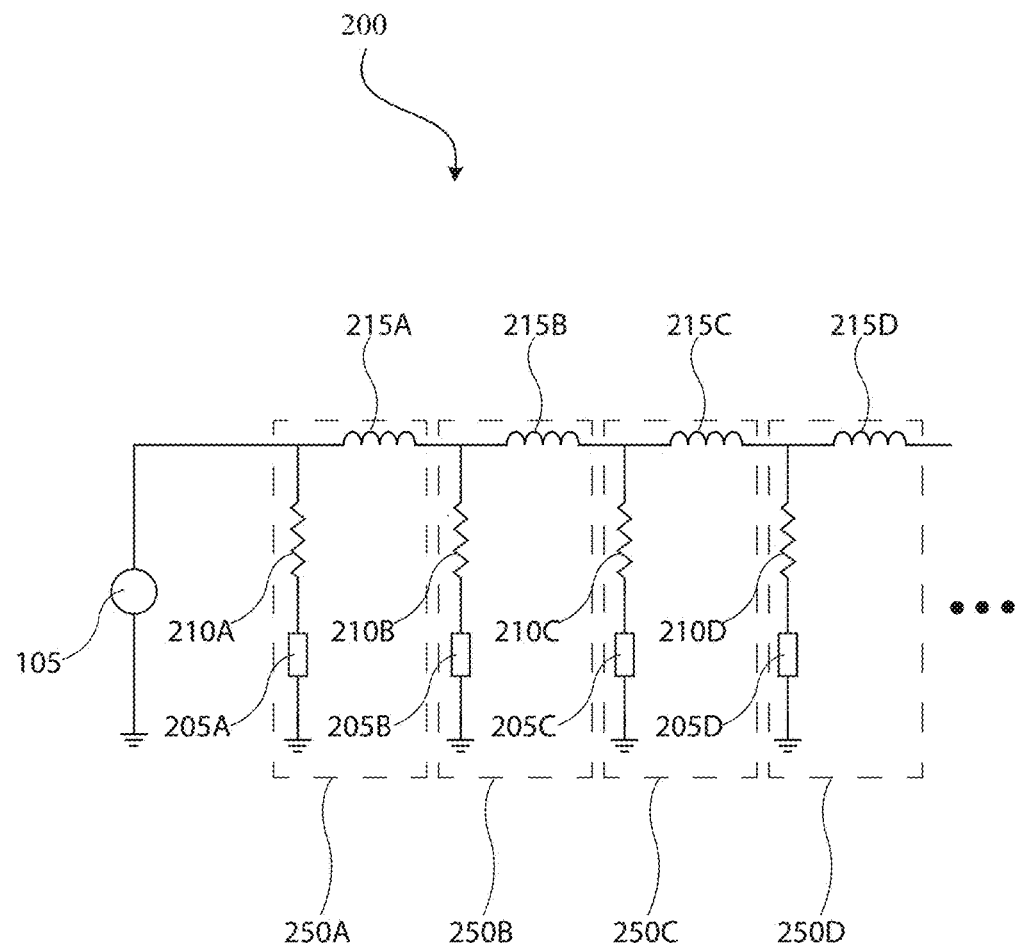
FIG. 2 is a circuit diagram of a nonlinear transmission line according to some embodiments.

FIG. 2 is a circuit diagram of a nonlinear transmission line 200 according to some embodiments. The nonlinear transmission line 200 may include an input that can connect to a high voltage pulser 105. In some embodiments, the nonlinear transmission line 200 can include the high voltage pulser 105.

The nonlinear transmission line 200 includes a first circuit element 250A that includes a first resistor 210A, a first nonlinear semiconductor junction capacitance (NSJC) device 205A, and a first inductor 215A. In some embodiments, the first circuit element 250A may be electrically coupled to both the high voltage pulser 105 and ground.

The nonlinear transmission line 200 includes a second circuit element 250B that includes a second resistor 210B, a second NSJC device 205B, and a second inductor 215B. In some embodiments, the second circuit element 250B may be electrically coupled to both the first inductor 215A and ground.

The nonlinear transmission line 200 includes a third circuit element 250C that includes a third resistor 210C, a third NSJC device 205C, and a third inductor 215C. In some embodiments, the third circuit element 250C may be electrically coupled to both the second inductor 215B and ground.

The nonlinear transmission line 200 includes a fourth circuit element 250D that includes a fourth resistor 210D, a fourth NSJC device 205D, and a fourth inductor 215D. In some embodiments, the fourth circuit element 250D may be electrically coupled to both the third inductor 215C and ground.

The nonlinear transmission line 200 may include an output that can provide a peak voltage that is similar to the peak voltage provided by a high voltage pulser 105 and/or having a rise time that is faster than the rise time of the input.

The nonlinear transmission line 200 shown in FIG. 2 shows four circuit elements (each having a resistor and/or an NSJC device). Any number of circuit elements and/or inductors may be included. For example, a nonlinear transmission line may include five or more circuit elements and/or inductors. As another example, a nonlinear transmission line may include ten or more circuit elements and/or inductors.

In some embodiments, each NSJC device (e.g., NSJC device 205A, 205B, 205C, 205D, etc.) may have an inductance less than about 500 nH, 250 nH, 100 nH. 50 nH, 25 nH, etc. In some embodiments, each NSJC device (e.g., NSJC device 205A, 205B, 205C, 205D, etc.) may include a plurality of NSJC devices in series or parallel.

In some embodiments, each resistor (e.g., resistor 210A, 210B, 210C, 210D, etc.) may have a resistance less than about 1,000 ohms, 500 ohms, 250 ohms, 100 ohms, 50 ohms, 25 ohms, etc. In some embodiments, each resistor (e.g., resistor 210A, 210B, 210C, 210D, etc.) may include a plurality of resistors in series or parallel.

In some embodiments, each inductor (e.g., inductor 215A, 215B, 215C, 215D, etc.) may have an inductance less than about 500 nH, 250 nH, 100 nH. 50 nH, 25 nH, etc. In some embodiments, each inductor (e.g., inductor 215A, 215B, 215C, 215D, etc.) may include a plurality of inductors arranged in series or parallel.

Figure 3:
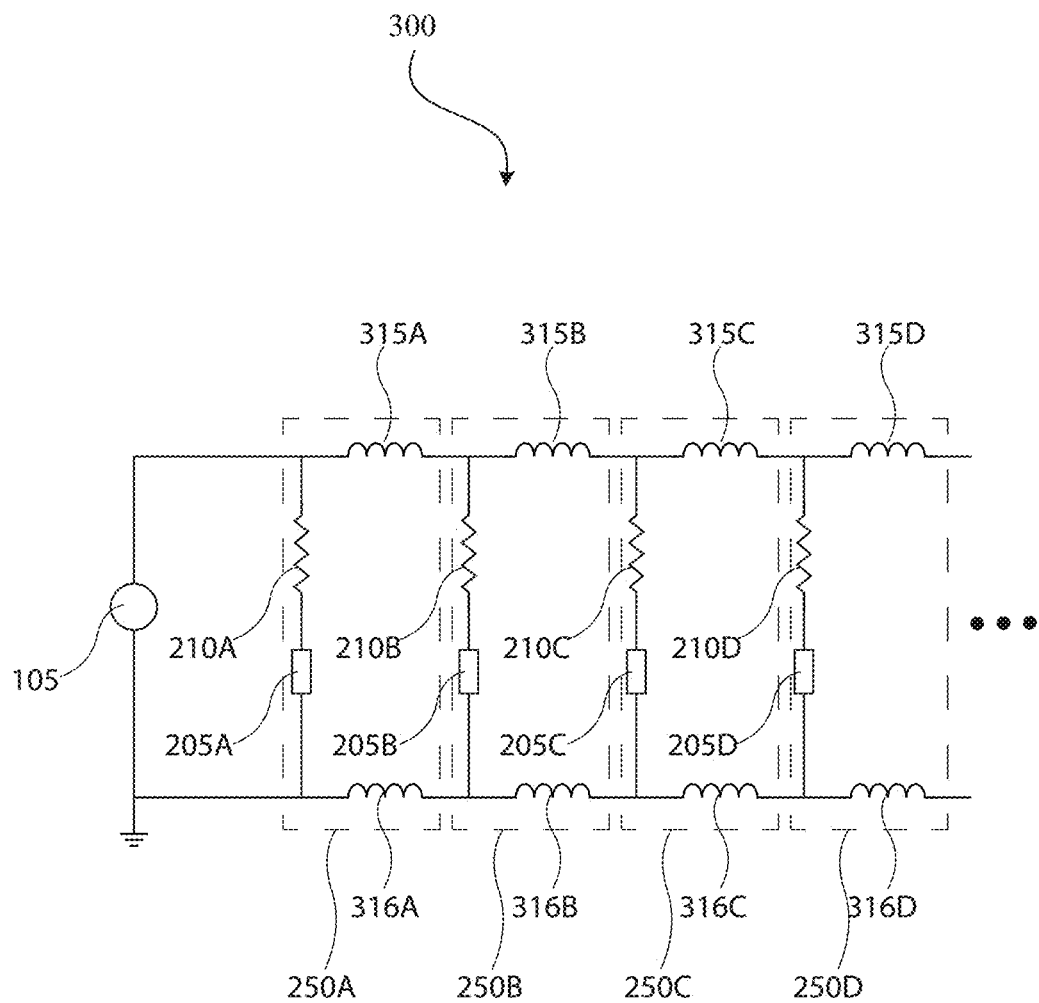
FIG. 3 is a circuit diagram of a nonlinear transmission line according to some embodiments.

FIG. 3 is a circuit diagram of a nonlinear transmission line 300 according to some embodiments. The nonlinear transmission line 300 may include an input that can connect to the high voltage pulser 105 as described in FIG. 1 and/or FIG. 2. In some embodiments, the nonlinear transmission line 300 can include the high voltage pulser 105. The nonlinear transmission line 300 may be similar to the nonlinear transmission line 200, in this example the nonlinear transmission line 300 includes two inductors between circuit elements rather than one inductor.

The nonlinear transmission line 300 includes a first circuit element 250A that includes a first resistor 210A, a first nonlinear semiconductor junction capacitance (NSJC) device 205A, a first upper inductor 315A, and a first lower inductor 316A. In some embodiments, the first circuit element 250A may be electrically coupled to both the high voltage pulser 105 and ground.

The nonlinear transmission line 300 includes a second circuit element 250B that includes a second resistor 210B, a second NSJC device 205B, a second upper inductor 315B, and a second lower inductor 316B. In some embodiments, the second circuit element 250B may be electrically coupled to both the first upper inductor 315A and the first lower inductor 316A.

The nonlinear transmission line 300 includes a third circuit element 250C that includes a third resistor 210C, a third NSJC device 205C, a third upper inductor 315C and a third lower inductor 316C. In some embodiments, the third circuit element 250C may be electrically coupled to both the second upper inductor 315B and the second lower inductor 316B.

The nonlinear transmission line 300 includes a fourth circuit element 250D that includes a fourth resistor 210D, a fourth NSJC device 205D, a fourth upper inductor 315D, and a fourth lower inductor 316D. In some embodiments, the fourth circuit element 250D may be electrically coupled to both the third upper inductor 315C and the third lower inductor 316C.

The nonlinear transmission line 300 may include an output that can provide a peak voltage that is similar to the peak voltage provided by the input 105 and/or having a rise time that is faster than the rise time of the input.

The nonlinear transmission line 300 shown in FIG. 3 shows four circuit elements (each having a resistor and an NSJC device). Any number of circuit elements and/or inductors may be included. For example, a nonlinear transmission line may include five or more circuit elements and/or inductors. As another example, a nonlinear transmission line may include ten or more circuit elements and/or inductors.

In some embodiments, each NSJC device (e.g., NSJC device 205A, 205B, 205C, 205D, etc.) may have an inductance less than about 500 nH, 250 nH, 100 nH. 50 nH, 25 nH, etc. In some embodiments, each NSJC device (e.g., NSJC device 205A, 205B, 205C, 205D, etc.) may include a plurality of NSJC devices in series or parallel. In some embodiments, each NSJC device (e.g., NSJC device 205A, 205B, 205C, 205D, etc.) may have a capacitance less than about 10 nF, 5 nF, 2.5 nF, 1 nF, etc.

In some embodiments, each resistor (e.g., resistor 210A, 210B, 210C, 210D, etc.) may have a resistance less than about 1,000 ohms, 500 ohms, 250 ohms, 100 ohms, 50 ohms, 25 ohms, etc. In some embodiments, each resistor (e.g., resistor 210A, 210B, 210C, 210D, etc.) may include a plurality of resistors in series or parallel.

In some embodiments, each inductor (e.g., inductor 315A, 315B, 315C, 315D, 316A, 316B, 316C, 316D, etc.) may have an inductance less than about 500 nH, 250 nH, 100 nH. 50 nH, 25 nH, 10 nH, etc. In some embodiments, each inductor (e.g., inductor 315A, 315B, 315C, 315D, 316A, 316B, 316C, 316D, etc.) may include a plurality of inductors arranged in series or parallel.

Figure 4:
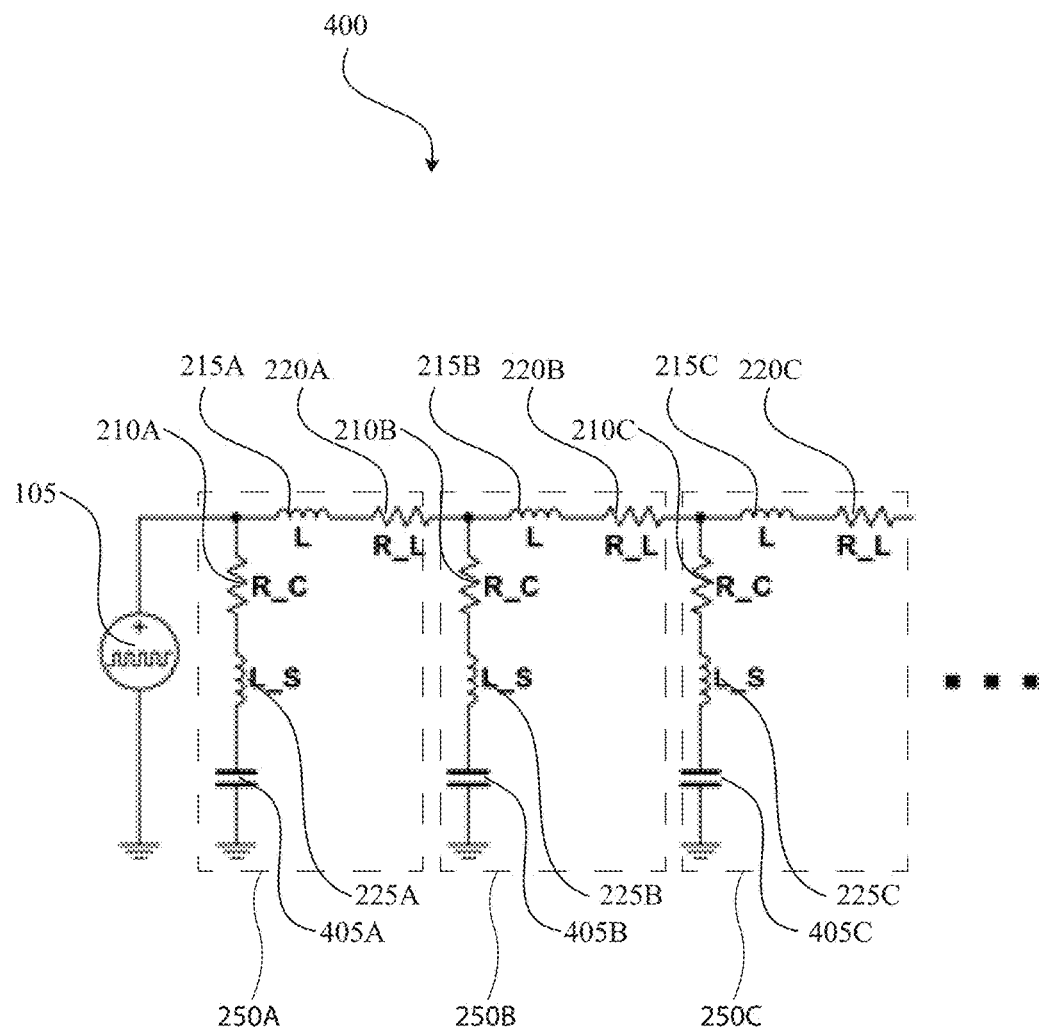
FIG. 4 is a circuit diagram of a nonlinear transmission line according to some embodiments.

FIG. 4 is a circuit diagram of a nonlinear transmission line 400 according to some embodiments. The circuit diagram of the nonlinear transmission line 400 shows a number of stray elements such as stray resistance represented as a resistor and stray inductance represented as an inductor.

In some embodiments, the nonlinear transmission line 400 may include a plurality of NSJC devices 405A, 405B, 405C. Because the nonlinear capacitance of the NSJC devices is being exploited, the NSJC devices are schematically represented as a capacitor in FIG. 4. In some embodiments, the nonlinear transmission line 400 may include a plurality of circuit elements that each include a resistor (e.g., one of resistors 210A, 210B, 210C) and a resistor (e.g., a respective one of resistors 210A, 210B, 210C), for example, may be electrically coupled in series with a NSJC device (e.g., a respective one of the plurality of NSJC devices 405A, 405B, 405C). In some embodiments, the transmission line 400 may include a plurality of inductors 215A, 215B, 215C. Each one of the plurality of inductors, for example, may be electrically coupled with two circuit elements and/or a circuit element and an output.

While the transmission line 400 shown in FIG. 4 shows three circuit elements any number of circuit elements may be used. In some embodiments, each NSJC device 405A, 405B, or 405C may include one or more NSJC devices in series or parallel (e.g., 2, 3, 5, 7, 9, 12, 15 NSJC devices arranged in series), which may, for example, provide for a NSJC device combination with sufficient operating voltage such as, for example, a combined operating voltage greater than 500 V, 1 kV, 2.5 kV, 5 kV, 10 kV, etc. In some embodiments, an NSJC device may include a diode such as, for example, silicon carbide Schottky diode(s), silicon diode(s), or other diode(s). In some embodiments, each NSJC device 405A, 405B, 405C may include a semiconductor device that has a nonlinear capacitance as a function of junction voltage.

Each NSJC device 405A, 405B, 405C (or combination of NSJC devices), for example, may have a voltage ratings of more than 1.0 kV such as, for example, 1.1, 1.2, 1.3, 1.4, 1.5, 1.6, 1.8, 1.9, 2.0, 2.1, 2.2, 2.3, 3.4 kV. In some embodiments, each NSJC device 405A, 405B, 405C (or combination of NSJC devices) may have a stray inductance 225A, 225B, 225C less than about 1,000 nH, 750 nH, 500 nH, 250 nH, 100 nH, 50 nH, 30 nH, 20 nH, 15 nH, 10 nH, etc.

While the nonlinear transmission line 400 shown in FIG. 4 shows three resistors 210A, 210B, 210C in parallel with each other, any number of resistors may be used for each respective resistors 210A, 210B, 210C. In some embodiments, the resistors 210A, 210B, 210C may have a resistance of less than about 1,000 ohms, 500 ohms, 250 ohms, 100 ohms, 50 ohms, etc.

While the nonlinear transmission line 400 shown in FIG. 4 shows three inductors 215A, 215B, 215C any number of inductors may be used. The inductors, for example, may have an inductance of less than about 250 nH, 100 nH, 50 nH, 25 nH, 10 nH, etc.

The nonlinear transmission line 400 may include an input 150. The input, for example, may be coupled with a nanosecond pulser. The input, in some embodiments, may be coupled with one or more additional nonlinear transmission lines.

In some embodiments, the nonlinear transmission line 400 may be coupled with a nanosecond pulser that can produce a high voltage pulse train with a plurality of pulses. The high voltage pulse train produced by the nanosecond pulser may have any number of characteristics such as, for example, having a voltage such as, for example, above 1 kV, 2.5 kV, 5 kV, 10 kV, 15 kV, 20 kV, etc.; and a fast rise time such as, for example, a rise time less than about 50 ns, 40 ns, 30 ns, 20 ns, 10 ns, etc. The plurality of pulses of the high voltage pulse train may, for example, have variable pulse widths (e.g., 3-275 ns).

In some embodiments, the nonlinear transmission line 400 may reduce the rise time of the high voltage pulse train while maintaining the variable pulse widths and/or the pulse repetition frequency of the input high voltage pulse train. For example, the nonlinear transmission line 400 may output a high voltage pulse train having, for example, a high voltage, a reduced rise time (e.g., reduced by 20 ns), and a variable pulse width (e.g., 3-275 ns) corresponding to the variable pulse width produced from the nanosecond pulser.

Figure 5:
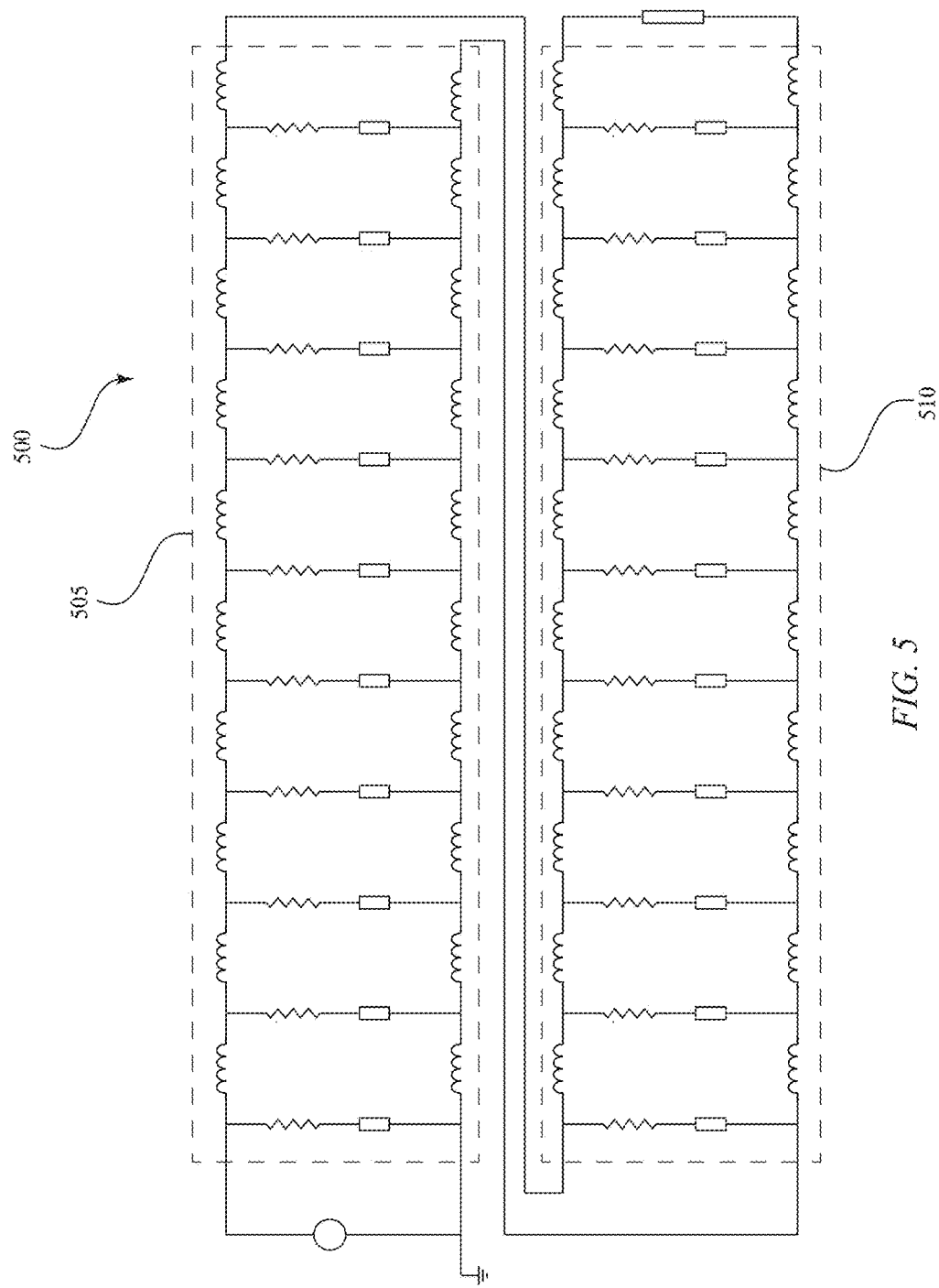
FIG. 5 is a circuit diagram of a nonlinear transmission line that includes any number of series combinations of NSJC devices.
Figure 6:
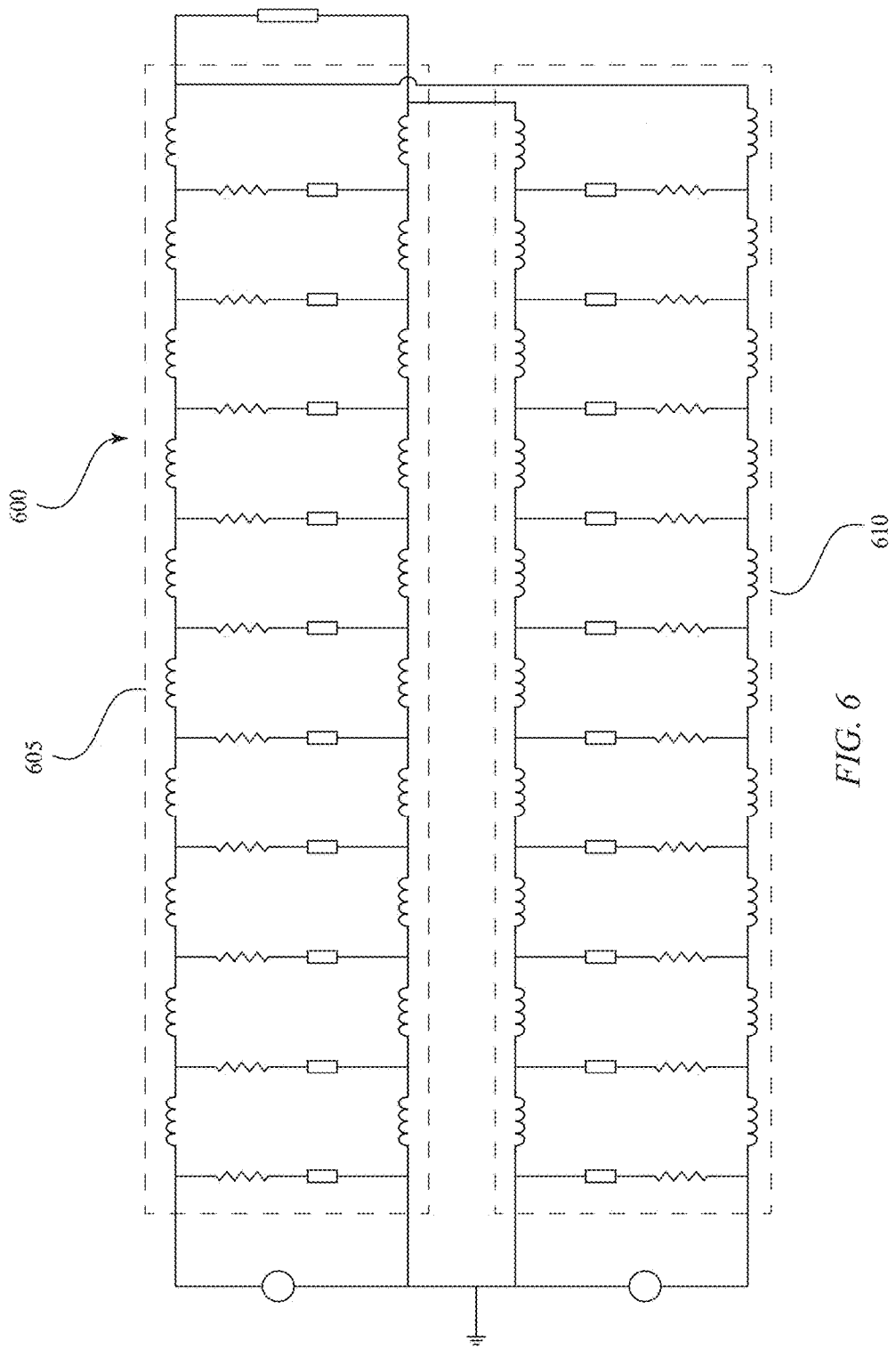
FIG. 6 is a circuit diagram of a nonlinear transmission line that includes any number of series combinations of NSJC devices.

The nonlinear transmission line 400 may include any number of series combinations of NSJC devices and/or any number of series combinations of resistors in parallel with an inductor. FIG. 5 and FIG. 6 illustrate some examples.

The nonlinear transmission line 400 may be described as having a plurality of circuit elements. For example, FIG. 4 illustrates three circuit elements. The first circuit element 250A includes the first NSJC device 205A having first stray inductance 225A, the first resistor 210A, and the first inductor 215A with first stray resistance 220A. The second circuit element 250B includes the second NSJC device 205B having second stray inductance 225B, the second resistor 210B, and the second inductor 215B with second stray resistance 220B. The third circuit element 250C includes the third NSJC device 205C having third stray inductance 225C, the third resistor 210C, and the third inductor 215C with third stray resistance 220C. The first circuit element 250, the second circuit element 250B, and the third circuit element 250C may be arranged in parallel. The nonlinear transmission line 400 may include any number of circuit elements arranged in parallel. The number of circuit elements may be determined based on the increase to the rise time of a pulse as described in more detail below.

FIG. 5 is a circuit diagram of two nonlinear transmission lines 500 arranged in series according to some embodiments. The first nonlinear transmission line 505 includes 10 circuit elements and the second nonlinear transmission line 510 includes 10 circuit elements. Any number of circuit elements may be included in either nonlinear transmission line. Any number of nonlinear transmission lines may be arranged in series. A high voltage pulser 105 drives the two nonlinear transmission lines 500.

FIG. 6 is a circuit diagram of two nonlinear transmission lines 600 arranged in parallel according to some embodiments. The first nonlinear transmission line 605 includes 10 circuit elements and the second nonlinear transmission line 610 includes 10 circuit elements. Any number of circuit elements may be included in either nonlinear transmission line. Any number of high voltage pulsers 105 may drive the first nonlinear transmission line 605. Another high voltage pulser 105 may drive the second nonlinear transmission line 610. Both first nonlinear transmission line 605 and the second nonlinear transmission line 610 are coupled to the same load.

In some embodiments, the plurality of inductors of a nonlinear transmission line may have inductances that vary. For example, the inductance of inductors further from the input (e.g., the high voltage pulser 105) may have an inductance lower than inductors closer to the input. As another example, the inductance of inductors further from the input (e.g., the high voltage pulser 105) may have an inductance higher than inductors closer to the input.

In some embodiments, the plurality of resistors of a nonlinear transmission line may have resistances that vary. For example, the resistance of resistors further from the input (e.g., the high voltage pulser 105) may have a resistance lower than resistors closer to the input. As another example, the resistance of resistors further from the input (e.g., the high voltage pulser 105) may have a resistance higher than resistors closer to the input.

In some embodiments, the plurality of NSJC devices of a nonlinear transmission line may have capacitances that vary. For example, the capacitance of NSJC devices further from the input (e.g., the high voltage pulser 105) may have a capacitance lower than NSJC devices closer to the input. As another example, the capacitance of NSJC devices further from the input (e.g., the high voltage pulser 105) may have a capacitance higher than NSJC devices closer to the input.

Figure 7:
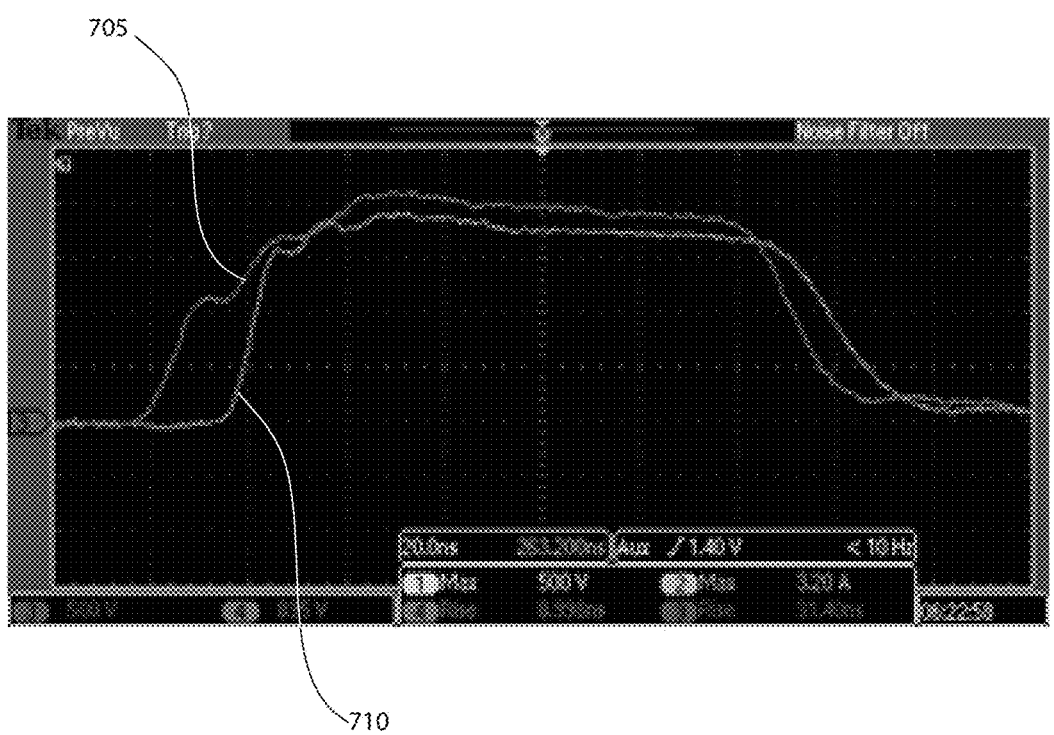
FIG. 7 illustrates an input pulse waveform and an output waveform of a nonlinear transmission line.

FIG. 7 illustrates an input pulse 705 and an output pulse 710 of a nonlinear transmission line. As shown in FIG. 7, the output pulse 710 has a steeper and/or faster and/or sharper rise time. In particular, in this example, the input waveform has a 33 ns rise time and the output waveform has a 9 ns rise time, which has been sharpened by the nonlinear transmission line. In addition, in this example, the output pulse has a pulse width that is substantially the same as the pulse width of the input pulse. The flat top voltage in this example may be about 10 kV. The nonlinear transmission line in this example, can be said to have sharpened the rise time, while maintaining the high voltage of the input pulse and pulse width of the input pulse.

In some embodiments, the high voltage pulser 105 may include a nanosecond pulser and/or may provide a high voltage pulse to the input of a nonlinear transmission line 200. The nanosecond pulser may provide a pulse that has a rise time such as, for example, a rise time less than about 250 ns, 200 ns, 150 ns, 100 ns, 50 ns, 30 ns, 20 ns, 10 ns, 5 ns, 1 ns, etc. The output of the nonlinear transmission line 400 may provide an output from the input pulse that has a rise time that is less than about 10 ns, 20 ns, 30 ns, 40 ns, 50 ns, etc. faster than the input rise time. For example, if the input pulse has a 50 ns rise time, the output pulse may have a 20 ns rise time.

An example of a reduced rise time between the input pulse and the output pulse or a nonlinear transmission line is shown in FIG. 7. A waveform of the input pulse 705 is shown next to a waveform of the output pulse 710. As shown in the figure, the rise time of the input pulse 705 is longer than the rise time of the output pulse 710. In this example, the input rise time is 31 ns and the output rise time has been compressed to 9 ns.

The rise time may be measured, for example, as the amount of time it takes for the pulse to rise from 10% to 90% of the peak voltage.

The high voltage input or high voltage output pulse, for example, may have a voltage greater than about 1 kV, 5 kV, 10 kV, 15 kV, 20 kV, 30 kV, 50 kV, 100 kV, etc. The high voltage input or high voltage output pulse, for example, may have a variable pulse width. The high voltage pulse, for example, may have a pulse width that is greater than 1 ns, 2 ns, 5 ns, 10 ns, 20 ns, 50 ns, 100 ns, 250 ns, 500 ns, etc. The high voltage input or high voltage output pulse, for example, may have an adjustable pulse repetition rate. The high voltage input or high voltage output pulse, for example, may have a pulse repetition rate greater than 50 kHz, 100 kHz, 250 kHz, 500 kHz, 1,000 kHz, etc.

In some embodiments, a nonlinear transmission line can include a NSJC device that has the following capacitance:

$$C(V) = \frac{C_{j0}}{(1 + V/\varphi)^m}.$$

Where $C_{j0}$ is the junction capacitance of the NSJC at zero voltage. V is the voltage. $\varphi$ is the junction potential. m is a constant value between 0.25 and 0.75 that varies based on the type of NSJC.

In some embodiments, the overall capacitance of a Schottky diode, which may be used as a NSJC device, may be inversely proportional to the number of diodes (e.g., diode, resistor, and inductor combinations) are included in the nonlinear transmission line, for example:

$$C_s = \frac{1}{n} \frac{C_{j0}}{\sqrt{1 + V_s/n\varphi}}$$

This equation may be used for Schottky diodes, and may not necessarily be used for all NSJC devices.

In some embodiments, the overall capacitance, $C_s$, of the nonlinear transmission line will decrease with increased number of diode (or NSJC device) sections n. $C_{j0}$ is the junction capacitance at zero voltage of a single diode, $\varphi$ is the junction potential and $V_s$ is the voltage across the nonlinear transmission line.

In some embodiments, as a general rule of thumb, in some conditions, the characteristic impedance of the nonlinear transmission line 400 may be less than about 180 ohms. In some embodiments, the inductance of the nonlinear transmission line can be calculated, for example, to impedance match to 180Ω using the following formula, where $V_{40\%}$ is 40% of $V_{max}$:

$$Z = \sqrt{\frac{L}{C(V_{40\%})}}.$$

In some embodiments, the impedance of the nonlinear transmission line 400 may vary as a function of the voltage applied and/or, for example, time, as the input pulse is applied.

In some embodiments, the value of resistors 210A, 210B, 210C may be calculated to critically damp out any ringing from a stray inductance 225A, 225B, 225C and/or any variable capacitance of the NSJC devices 405A, 405B, 405C. In an ideal nonlinear transmission line, for example, with no stray inductance 225A, 225B, 225C, the rise time may be limited by the Bragg frequency. However, in many example embodiments, the stray inductance may limit the rise time. The resonant rise time may be calculated using $C(V_{max})$ and $C(V_{40\%})$ to provide two different reference points.

In some embodiments, as a general rule, the amount of change to the rise time for the nonlinear transmission line 400 may be determined from $$\Delta t \approx \sqrt{LC_{10\%}} - \sqrt{LC_{90\%}}.$$

From this equation and the equation for the overall capacitance, $C_s$, described above, the number of diode sections, N, can be determined to achieve a desired rise time, $\Delta t$.

Each nonlinear transmission line, for example, could be used to reduce rise times down a step. For instance, one from 10 ns to 5 ns and the second from 5 ns to 2 ns and so on. Each could be made to be optimized for the specific step it's taking.

Figure 8:
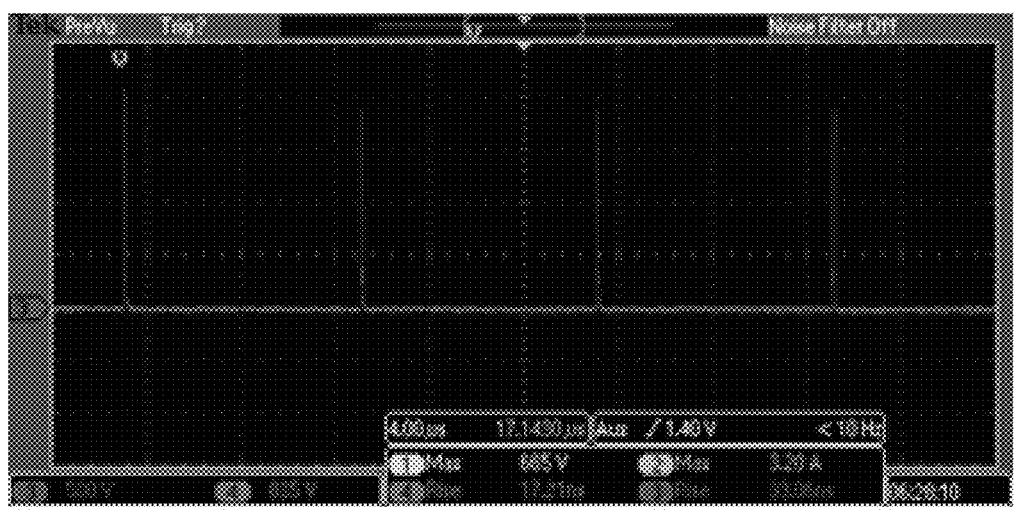
FIGS. 8 and 9 are waveforms having high pulse repetition frequencies.

FIG. 8 illustrates a nonlinear transmission line receiving an input pulse train with a pulse repetition frequency of 100 kHz and producing a corresponding output pulse train with a pulse repetition frequency of 100 kHz. In addition, the voltage of the output can be the same as the input voltage. In the example shown in FIG. 8, a voltage divider was included at the output, which lowered the voltage as shown in the figure. The voltage divider is not required.

Figure 9:
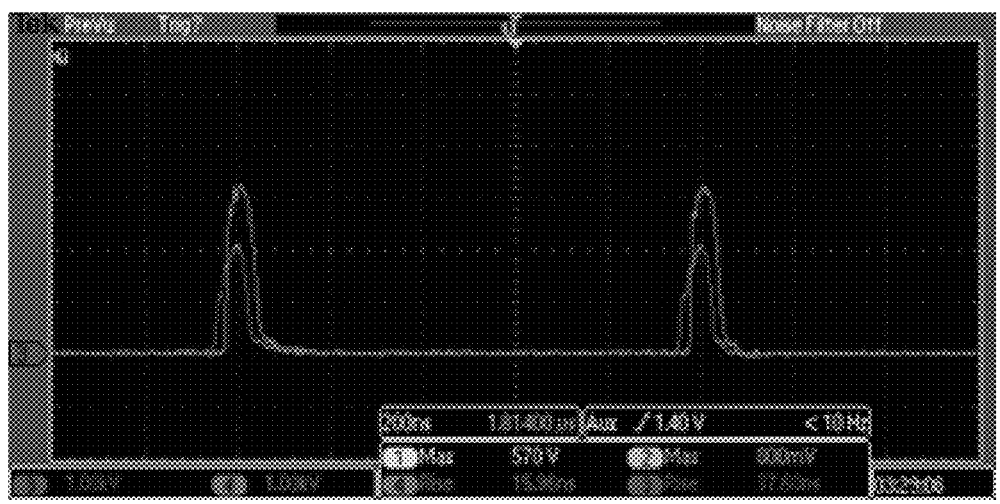

FIG. 9 illustrates a nonlinear transmission line receiving an input pulse train with a pulse repetition frequency of 1,000 kHz and producing a corresponding output pulse train with a pulse repetition frequency of 1,000 kHz. In the waveforms shown in FIG. 8 and FIG. 9 the pulse width is about 100 ns. In addition, the voltage of the output can be the same as the input voltage. In the example shown in FIG. 9, a voltage divider was included at the output, which lowered the voltage as shown in the figure. The voltage divider is not required.

The term "substantially" means within 5% or 10% of the value referred to or within manufacturing tolerances.

Various embodiments are disclosed. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing art to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical, electronic, or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A high voltage nonlinear transmission line comprising:
   a high voltage input configured to receive electrical pulses having a first peak voltage that is greater than 5 kV having a first rise time;
   a plurality of circuit elements, each of the plurality of circuit elements having a resistor and a nonlinear semiconductor junction capacitance device,
   a plurality of inductors, at least one of the plurality of inductors is electrically coupled between two circuit elements of the plurality of circuit elements; and
   a high voltage output providing a second peak voltage with a second rise time that is faster than the first rise time.

2. The high voltage nonlinear transmission line according to claim 1, wherein the second peak voltage is substantially the same as the first peak voltage.

3. The high voltage nonlinear transmission line according to claim 1, wherein each of the plurality of inductors has an inductance of less than about 500 nH.

4. The high voltage nonlinear transmission line according to claim 1, wherein each of the plurality of resistors has a resistance of less than about 1000 ohms.

5. The high voltage nonlinear transmission line according to claim 1, wherein each of the plurality of nonlinear semiconductor junction capacitance devices has an inductance of less than about 100 nH.

6. The high voltage nonlinear transmission line according to claim 1, wherein each of the nonlinear semiconductor junction capacitance devices comprises a diode.

7. The high voltage nonlinear transmission line according to claim 1, wherein each of the nonlinear semiconductor junction capacitance devices has a capacitance that changes nonlinearly with voltage.

8. The high voltage nonlinear transmission line according to claim 1, wherein the plurality of circuit elements comprises at least 10 circuit elements.

9. The high voltage nonlinear transmission line according to claim 1, wherein each of the nonlinear semiconductor junction capacitance devices comprises a plurality of nonlinear semiconductor junction capacitance devices arranged in parallel and/or series.

10. The high voltage nonlinear transmission line according to claim 1, wherein the nonlinear semiconductor junction capacitance device has a capacitance less than 5 nF.

11. A nonlinear transmission line comprising:
    a high voltage input configured to receive electrical pulses having a first peak voltage that is greater than 5 kV having a first rise time;
    a first circuit element electrically coupled with the high voltage input, the first circuit element comprising:
       a first nonlinear semiconductor junction capacitance device;
       a first resistor electrically coupled in series with the first nonlinear semiconductor junction capacitance device; and
       and a first inductor;
    a second circuit element electrically coupled with the first inductor, the second circuit element comprising:
       a second nonlinear semiconductor junction capacitance device;
       a second resistor electrically coupled in series with the second nonlinear semiconductor junction capacitance device; and
       a second inductor
    a third circuit element electrically coupled with the second inductor, the third circuit element comprising:
       a third nonlinear semiconductor junction capacitance device;
       a third resistor electrically coupled in series with the third nonlinear semiconductor junction capacitance device; and
       a third inductor;
    a fourth circuit element electrically coupled with the third inductor, the fourth circuit element comprising:
       a fourth nonlinear semiconductor junction capacitance device;
       a fourth resistor electrically coupled in series with the fourth nonlinear semiconductor junction capacitance device; and
       a fourth inductor;
    a fifth circuit element electrically coupled with the fourth inductor, the fifth circuit element comprising:
       a fifth nonlinear semiconductor junction capacitance device;
       a fifth resistor electrically coupled in series with the fifth nonlinear semiconductor junction capacitance device; and
       a fifth inductor; and
    a high voltage output providing a second peak voltage with a second rise time that is faster than the first rise time, the high voltage output electrically coupled with the fifth inductor.

12. The nonlinear transmission line according to claim 11, wherein the first resistor, the second resistor, the third resistor, the fourth resistor, and the fifth resistor have substantially the same resistance.

13. The nonlinear transmission line according to claim 11, wherein at least two of the first resistor, the second resistor, the third resistor, the fourth resistor, and the fifth resistor have different resistance.

14. The nonlinear transmission line according to claim 11, wherein the first inductor, the second inductor, the third inductor, the fourth inductor, and the fifth inductor have substantially the same inductance.

15. The nonlinear transmission line according to claim 11, wherein at least two of the first inductor, the second inductor, the third inductor, the fourth inductor, and the fifth inductor have different inductance.

16. The nonlinear transmission line according to claim 11, wherein the first nonlinear semiconductor junction capacitance device, the second nonlinear semiconductor junction capacitance device, the third nonlinear semiconductor junction capacitance device, the fourth nonlinear semiconductor junction capacitance device, and/or the fifth nonlinear semiconductor junction capacitance device each have a stray inductance of less than about 100 nH.

17. The nonlinear transmission line according to claim 11, wherein the first inductor, the second inductor, the third inductor, the fourth inductor, and the fifth inductor each have an inductance of less than about 500 nH.

18. The nonlinear transmission line according to claim 11, wherein the first resistor, the second resistor, the third resistor, the fourth resistor, and the fifth resistor each have a resistance of less than about 1000 ohms.

19. A high voltage device comprising:
   a high voltage input configured to receive electrical pulses having a first peak voltage that is greater than 5 kV having a first rise time;
   a first nonlinear transmission line electrically coupled with the high voltage input, the first nonlinear transmission line comprising:
      a first plurality of circuit elements, each of the first plurality of circuit elements having a resistor and a nonlinear semiconductor junction capacitance device; and
      a first plurality of inductors, at least one of the first plurality of inductors is electrically coupled between two circuit elements of the first plurality of circuit elements;
   a second nonlinear transmission line electrically coupled with the first nonlinear transmission line, the second nonlinear transmission line comprising:
      a second plurality of circuit elements, each of the second plurality of circuit elements having a resistor and a nonlinear semiconductor junction capacitance device; and
      a second plurality of inductors, at least one of the second plurality of inductors is electrically coupled between two circuit elements of the second plurality of circuit elements; and
   a high voltage output electrically coupled with either or both the first nonlinear transmission line and the second nonlinear transmission line, the high voltage output providing a second peak voltage with a second rise time that is faster than the first rise time.

20. The high voltage device according to claim 19, wherein the first nonlinear transmission line is coupled in series with the second nonlinear transmission line.

21. The high voltage device according to claim 19, wherein the first nonlinear transmission line is coupled in parallel with the second nonlinear transmission line.

\* \* \* \* \*